United States Patent [19]

Fréchet et al.

[11] Patent Number: 5,532,106
[45] Date of Patent: Jul. 2, 1996

[54] POSITIVE-TONE PHOTORESIST CONTAINING DIESTER DISSOLUTION INHIBITORS

[75] Inventors: Jean M. J. Fréchet, Ithaca, N.Y.; Sze-Ming Lee, Pittsburgh, Pa.

[73] Assignee: Cornell Research Foundation, Inc., Ithaca, N.Y.

[21] Appl. No.: 299,213

[22] Filed: Aug. 31, 1994

[51] Int. Cl.$^6$ .................................. G03F 7/023
[52] U.S. Cl. .................. 430/191; 430/192; 430/270.1
[58] Field of Search ................... 430/270, 191, 430/192, 270.1

[56] References Cited

U.S. PATENT DOCUMENTS 4,657,845  4/1987  Fréchet et al. ................. 430/326

FOREIGN PATENT DOCUMENTS 3107160  5/1991  Japan .

OTHER PUBLICATIONS

Belluš, et al., Photochemical Rearrangement of Aryl, Vinyl, and Substituted Vinyl Esters and Amides of Carboxylic Acids, *Chem. Rev.* 67:599 (1967).

Bender, et al., Acylium Ion Formation in the Reactions of Carboxylic Acid Derivatives. IV. The Acid-catalyzed Hydrolysis of Methyl 4-Substituted-2,6-dimethylbenzoates, *J. Amer. Chem. Soc.* 85:37 (1963).

Bender, et al., Acylium Ion Formation in the Reactions of Carboxylic Acid Derivatives. II. The Hydrolysis and Oxygen Exchange of Methyl Mesitoate in Sulfuric Acid, *J. Amer. Chem. Soc.* 83:123 (1961).

Daehne, et al., Acyloxymethyl Esters of Ampicillin, *J. Medic. Chem.* 13:607 (1970).

Effenberger, et al., Die Fries-Umlagerung als Gleichgewichstreaktion, *Chem. Ber.* 115:1089 (1982).

Feely, et al., The Role of the Latent Image in a New Dual Image, Aqueous Developable, Thermally Stable Photoresist, *Polym. Eng. Sci.* 16:1101 (1986).

Freéchet, et al., The Photogeneration of Acid and Base Within Polymer Coatings: Approaches To Polymer Curing and Imaging, *Pure & Appl. Chem.*, 64(9):1239 (1992).

Hattori, et al., Chemical Amplification Positive Deep UV Resist Using Partially Tetrahydropyranyl-Protected Polyvinylphenol, *Proc. SPIE* 1925:146 (1993).

Hattori, et al., Dissolution Inhibition of Phenolic Resins by Diazonaphthoquinone: Effect of Polymer Structure, *Jpn. J. Appl. Phys.* 30:3125 (1991).

Hayashi, et al., Tetrahydropyranyl and Tetrahydrofuranyl Protected Polyhydroxystyrenes in Chemical Amplification Resist Systems for KrF Excimer Laser Lithography, *Polym. Mater. Sci.* 61:417 (1989).

Holmes, et al., Deep Ultraviolet Lithography for 500-nm Devices, Proc. *Proc. SPIE* 1264:61 (1990).

Houlihan, et al., Synthesis of 4-(t-butoxycarbonyl)-2, 6-dinitrobenzyl Tosylate, a Potential One Component Photoacid Generator and Dissolution Inhibitor Solubilizable Through Chemical Amplification, *Polym. Mater. Sci. Eng.* 66:38 (1992).

Houlihan, et al., Thermally Depolymerizable Polycarbonates. 2. Synthesis of Novel Linear Tertiary Copolycarbonates by Phase-Transfer Catalysis, *Macromolecules* 19:13 (1986).

Huang, et al., On the Dissolution of Novolak in Aqueous Alkali, *Macromolecules* 22:4106 (1989).

Ito, Aqueous Base Developable Deep UV Resist Systems Based on Novel Monomeric and Polymeric Dissolution Inhibitors, *Proc. SPIE* 920:33 (1988).

Jiang, et al., Chemically Amplified Deep UV Photoresists Based on Acetal-Protected Poly(Vinylphenols), *Polym. Mater. Sci. Eng.* 66:41 (1992).

Kochhar, et al., Conversion of Aldehydes into Geminal Diacetates, *J. Org. Chem.* 48:1765 (1983).

McKean, et al., Novolac Based Deep-UV Resists, *Proc. SPIE* 920:60 (1988).

Maltabes, et al., IX Deep UV Lithography With Chemical Amplification for 1-Micron DRAM Production, *Proc. SPIE* 1262:2 (1990).

Murata, et al., An Aqueous Base Developable Novel Deep-UV Resist For KrF Excimer Laser Lithography, *Proc. SPIE* 1262:8 (1990).

O'Brien, et al., Mid-UV Photoresists Combining Chemical Amplification and Dissolution Inhibition, *Proc. SPIE* 920:42 (1988).

Olah, et al., Catalysis by Solid Superacids; 16$^1$. Improved Nafion-H Catalyzed Preparation of 1,1-Diacetates from Aldehydes, *Synthesis* 82:962 (1982).

(List continued on next page.)

*Primary Examiner*—Charles L. Bowers, Jr.
*Assistant Examiner*—Christopher G. Young
*Attorney, Agent, or Firm*—Bell, Seltzer, Park & Gibson

[57] ABSTRACT

A positive-tone photoresist is provided. The photoresist comprises a polymer, a photoactive agent, and a dissolution inhibitor. The dissolution inhibitor comprises a compound of Formula I:

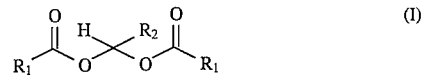

wherein $R_1$ is a $C_1$–$C_{20}$ alkyl, cyclo alkyl, bensyl, phenyl, alkyl substituted cyclo alkyl, alkoxy substituted cyclo alky, alkyl substituted phenyl, alkoxy substituted phenyl, acetoxy substituted phenyl, hydroxy substituted phenyl, t-butyloxycarbonyloxy substituted phenyl, diphenyl alkyl, alkyl substituted diphenyl, alkoxy substituted diphenyl, alkyl substituted diphenyl alkyl, or alkoxy substituted diphenyl alkyl; and $R_2$ is a $C_1$–$C_{20}$ alkyl, cyclo alkyl, benzyl, phenyl, alkyl substituted cyclo alkyl, alkoxy substituted cyclo alkyl, alkyl substituted phenyl, alkoxy substituted phenyl, hydroxy substituted phenyl, acetoxy substituted phenyl, or t-butyloxycarbonyloxy substituted phenyl.

The present invention also provides a method of making microelectronic structures.

21 Claims, No Drawings

OTHER PUBLICATIONS

Pawlowski, et al., Chemically Amplified DUV Photoresists Using a New Class of Photoacid Generating Compounds, *Proc. SPIE* 1262:16 (1990).

Pawloski, et al., Modified Polyhydroxystyrenes as Matrix Resins for Dissolution Inhibition Type Photoresists, *Proc. SPIE* 1262:391 (1990).

Powell, Lithography in the 1990s: The Best Demonstrated Practice, *Solid State Technology* 32:66 (1989).

Reck, et al., Novel Photoresist Design Based on Electrophilic Aromatic Substitution, *Polym. Eng. Sci.* 29:960 (1989).

Reichmanis, et al., A Study of the Photochemical Response of o–Nitrobenzyl Cholate Derivatives in P(MMA–MAA) Matrices *J. Polym. Sci.: Polym. Chem. Ed.*, 21:1075 (1983).

Schaedeli, et al., Aqueous Base Developable Deep–UV Resist Based on Chemically Amplified Crosslinking of Phenolic Resin, *Polym. Eng. Sci.* 20:1523 (1992).

Schwalm, SUCCESS: A Novel Concept Regarding Photoactive Compounds, *Proc. Polym. Mater. Sci. Eng.* 61:278 (1989).

Tarascon, et al., Poly(t–BOC–Styrene Sulfone)–Based Chemically Amplified Resists for Deep–UV Lithography, *Polym. Eng. Sci.* 29:850 (1989).

Turner, et al., High–$T_g$ Base–Soluble Copolymers As Novolac Replacement for Positive Photoresists, *Polym. Engl. Sci.* 26(16):1096 (1986).

Uchino, et al., Negative Resist Systems using Acid–Catalyzed Pinacol Rearrangement Reaction in a Phenolic Resin Matrix, *Proc. SPIE* 1466:429 (1991).

POSITIVE-TONE PHOTORESIST CONTAINING DIESTER DISSOLUTION INHIBITORS

FIELD OF THE INVENTION

The present invention relates to the lithography field, and more particularly to positive-tone photoresists including dissolution inhibitors, and to dissolution inhibitors for such formulations.

BACKGROUND OF THE INVENTION

Novolak/diazonaphthoquinone (DNQ) based resists have been the most widely used positive-tone photoresists in the manufacture of semiconductors since their introduction in the 1960's. However, the demand for ever decreasing feature size in microelectronic devices has pushed the novolak/DNQ resists to their limits in terms of attainable resolution with conventional exposure techniques. Imaging resolution can be improved through the use of shorter wavelength radiation, such as deep-UV, electron beam, X-ray and ion-beam. However, these techniques are not applicable to current DNQ based resists. Among these new technologies, deep-UV imaging is presently believed to have the best potential for implementation in large scale production in the future.

In addition to improved resolution, it is also desirable to provide positive-tone resist materials having improved sensitivity. One approach to improving sensitivity uses the concept of chemical amplification. Chemical amplification involves the photogeneration within the resists of species that catalyze subsequent chemical events. One method of chemical amplification includes dissolution inhibition, wherein a masked phenol or protected carboxylic acid is mixed with a phenolic resin, resulting in a drastic decrease in the dissolution rate of the polymer in aqueous base developing solutions. A photoactivated acid-catalyzed deprotection reaction is then used to free the phenol or the carboxylic acid. As a result, the dissolution inhibitor is converted into a dissolution promoter in the radiation exposed areas of the resist material, allowing for the development of positive-tone images.

Previously, simple esters have been proposed as dissolution inhibitors in positive-tone photoresist applications. Examples are proposed in M. O'Brien, et al. *Proc. SPIE* 920:42 (1988) and E. Reichmanis, et al., *J. Poly. Sci., Poly. Chem. Ed.* 21:1075 (1983).

There remains a need in the art for a positive-tone photoresist formulation having both high resolution and high sensitivity. There also remains a need in the art for positive-tone photoresist formulations which are useful in deep-UV image resolution techniques. Moreover, there remains a need in the art for positive-tone photoresist dissolution inhibitors capable of providing high sensitivity.

SUMMARY OF THE INVENTION

The positive-tone photoresist of the present invention comprises a polymer, a photoactive agent, and a dissolution inhibitor. The dissolution inhibitor comprises a compound of Formula I:

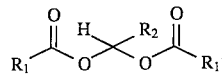
(I)

wherein $R_1$ is a $C_1$–$C_{20}$ alkyl, cyclo alkyl, benzyl, phenyl, alkyl substituted cyclo alkyl, alkoxy substituted cyclo alkyl, alkyl substituted phenyl, alkoxy substituted phenyl, acetoxy substituted phenyl, hydroxy substituted phenyl, t-butyloxycarbonyloxy substituted phenyl, diphenyl alkyl, alkyl substituted diphenyl alkyl, alkoxy substituted diphenyl alkyl, alkyl substituted diphenyl alkyl, or alkoxy substituted diphenyl alkyl; and $R_2$ is a hydrogen, $C_1$–$C_{20}$ alkyl, alkoxy, cyclo alkyl, benzyl, phenyl, alkyl substituted cyclo alkyl, alkoxy substituted cyclo alkyl, alkyl substituted phenyl, alkoxy substituted phenyl, hydroxy substituted phenyl, acetoxy substituted phenyl, or t-butyloxycarbonyloxy substituted phenyl.

The present invention also provides methods of making microelectronic structures. The inventive methods include the steps of: (a) forming a positive-tone photoresist on a microelectronic substrate, (b) irradiating predetermined sites of the photoresist to activate a photoactive agent at the predetermined sites, (c) heating the photoresist, and (d) removing matter from the predetermined sites to provide a positive-tone photoresist. The method of the present invention also contemplates additional, finishing steps such as etching.

The foregoing and other aspects of the present invention are explained in detail in the specification set forth below.

DETAILED DESCRIPTION OF THE INVENTION

The present invention provides a method of making a microelectronic structure comprising the steps of (a) forming a positive-tone photoresist as described below, on a microelectronic substrate; (b) irradiating predetermined sites of the photoresist; (c) heating the photoresist; and (d) removing matter from the predetermined, irradiated sites to provide a positive-tone photoresist.

The positive-tone photoresist includes a polymer, a photoactive agent, and a dissolution inhibitor. Suitable polymers for use in the present invention will be known to those skilled in the art. Preferably, the polymers will be transparent in at least a portion of the ultraviolet region of the electromagnetic spectrum. As used herein, the term "transparent" refers to a 0.001 mm thickness of polymer which essentially has a percent transparency of not less than 50% in the wavelengths between about 245 nm and about 440 nm. Preferrably, a 0.001 mm sample of the polymer has a percent transparency of not less than 50% at one or more of the following wavelengths: 248 nm, 254 nm, 313 nm, 365 nm, and 435 nm. Polymers which are useful in the present invention are generally soluble in aqueous base solution. Typically, suitable polymers include polymers containing phenolic, carboxylic acid or maleimide groups. Examples of useful polymers include, but are not limited to, poly(hydroxystyrene), novolak, poly (p-tert-butoxycarbonyloxystyrene), poly(dimethylhydroxystyrene), polymethacrylic acid, polyvinylbenzoic acid, poly (2-hydroxyhexafluoropropyl styrene), copolymers of styrene and maleimide as described in S. R. Turner et al., *Polym. Sci & Eng.* 26(16):1096 (1986), the disclosure of which is incorporated herein by reference in its entirety, and mixtures or copolymers of any two or more of the foregoing polymers. Preferably, the polymer is poly(hydroxystyrene) or novolak.

Any suitable photoactive agent known to those skilled in the art may be employed in the practice of the present invention. As used herein, the term "photoactive agent" refers to a compound whose chemical composition is altered upon exposure to radiation. Preferred photoactive agents include photoacid generators. Photoacid generators produce acid upon exposure to radiation. Photoacid generators which are suitable for the present invention typically produce strong acids upon exposure to radiation. J.M.J. Fréchet, Pure and Applied Chemistry 63(9):1239 (1992), the disclosure of which is incorporated herein by reference in its entirety, describes various photoacid generators which are useful in the present invention. Examples of suitable photoacid generators include but are not limited to a wide variety of sulfonium and iodonium salts, such as triphenylsulfonium hexafluoroantimonate, triphenylsulfonium triflate, triphenylsulfonium hexafluorophosphate, triphenylsulfonium hexafluoroarsenate, diphenyliodonium hexafluoroantimonate, diphenyliodonium triflate, diphenyliodonium hexafluorophosphate, diphenyliodonium hexafluoroarsenate and the like, halogenated aromatic compounds such as trichloromethyl triazine, o-nitrobenzyl sulfonates, tris-(methanesulfonyloxy)benzene, and aryl naphthoquinone-diazide-4-sulfonates. The photoactive agent may be present in an amount of between about 0.1 percent to about 10 percent or about 10 percent to about 50 percent based on the weight of the photoresist composition. Preferably, the photoactive agent is present in an amount of between about 1 to about 10 percent by weight of the photoresist.

The photoresist further includes a dissolution inhibitor of Formula (I)

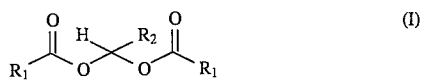

wherein $R_1$ is a $C_1$–$C_{20}$ alkyl, cyclo alkyl, benzyl, phenyl, alkyl substituted cyclo alkyl, alkoxy substituted cyclo alkyl, alkyl substituted phenyl, alkoxy substituted phenyl, acetoxy substituted phenyl, hydroxy substituted phenyl, t-butyloxycarbonyloxy substituted phenyl, diphenyl alkyl, alkyl substituted diphenyl, alkoxy substituted diphenyl, alkyl substituted diphenyl alkyl, or alkoxy substituted diphenyl alkyl; and $R_2$ is a hydrogen, $C_1$–$C_{20}$ alkyl, cyclo alkyl, benzyl, phenyl, alkyl substituted cyclo alkyl, alkoxy substituted cyclo alkyl, alkyl substituted phenyl, alkoxy substituted phenyl, hydroxy substituted phenyl, acetoxy substituted phenyl, or t-butyloxycarbonyloxy substituted phenyl.

Prefered $C_1$–$C_{20}$ alkyl substituents include methyl, ethyl, propyl, isopropyl, butyl, isobutyl, and tert-butyl. Preferred alkyl substituted cyclo alkyl substituents include cyclo alkyls substituted 1 to 4 times in ortho, meta, or para positions with $C_1$–$C_4$ alkyl. Preferred alkyl substituted phenyl substituents include phenyl groups substituted 1 to 4 times in ortho, meta, or para positions with $C_1$–$C_4$ alkyl. Particularly prefered alkyl substituted phenyl groups include phenyl groups substituted 1 to 3 times with methyl. Preferred alkoxy substituted phenyl groups include phenyl groups substituted 1 to 4 times in ortho, meta, or para positions with $C_1$–$C_4$ alkoxy. One preferred diphenyl alkyl substituent is diphenyl methyl.

Preferably, $R_1$ is selected from the group consisting of methyl, ethyl, benzyl, phenyl, trimethyl phenyl, methoxy phenyl, hydroxy phenyl, acetoxy phenyl, t-butyloxycarbonyloxy phenyl and diphenyl methyl. Preferably, $R_2$ is selected from the group consisting of hyrogen, phenyl, p-methyl phenyl, p-methoxy phenyl, p-hydroxy phenyl, p-acetoxy phenyl, and p-t-butyloxycarbonyloxy phenyl.

According to one preferred embodiment, $R_1$ is a diphenyl alkyl, and $R_2$ is hydrogen, According to a second preferred embodiment, $R_1$ is alkyl and $R_2$ is alkyl substituted phenyl. According to a third preferred embodiment, $R_1$ is phenyl and $R_2$ is alkyl substituted phenyl. In a fourth preferred embodiment, $R_1$ is alkyl substituted phenyl and $R_2$ is phenyl. In yet another preferred embodiment, $R_1$ is diphenyl alkyl and $R_2$ is phenyl. In yet another preferred embodiment, $R_1$ is diphenyl alkyl and $R_2$ is acetoxy substituted phenyl. In another preferred embodiment, $R_1$ is trialkyl substituted phenyl and $R_2$ is phenyl. In another preferred embodiment, $R_1$ is alkyl and $R_2$ is phenyl. In yet another preferred embodiment, $R_1$ is alkyl and $R_2$ is alkoxy substituted phenyl.

Examples of dissolution inhibitors useful in the method of the present invention include, but are not limited to:
(4-methylphenyl)methanediol dipropionate,
(4-methylphenyl)methanediol dibenzoate,
phenylmethanediol bis(phenylacetate),
phenylmethanediol bis(diphenylacetate),
(4-acetyloxyphenyl)methanediol,
bis(diphenyl-acetate),
phenylmethanediol bis(2,4,6-trimethylbenzoate),
(4-methoxyphenyl) methanediol bis(diphenylacetate),
(4-ethoxyphenyl) methanediol bis(diphenylacetate), and
(4-hydroxyphenyl) methanediol bis(diphenylacetate).

The dissolution inhibitor is typically present in the amount of between about 1 percent to about 50 percent, based on the weight of the photoresist. Preferably, the dissolution inhibitor is present in an amount of between about 5 to about 25 percent by weight of the photoresist.

The positive-tone photoresist may be formed according to methods known to those skilled in the art. Namely, the photoresist may be provided alone, as a sheet or film. More preferably, the photoresist is formed on a microelectronic substrate. Suitable substrates are known to those skilled in the art. For example, the photoresist may be formed as a coating on a microcrystalline silicon or other semiconductor substrate. Other suitable substrates include printed circuit boards or other secondary level packaging substrates.

Suitable methods of coating the photoresist on the substrate will be known to those skilled in the art. For example, the photoresist may be coated on a substrate using spincoating techniques which are well known in the art. Spin-coating is the preferred method of coating the photoresist on a substrate, although alternative methods known to those skilled in the art are contemplated by the present invention as well.

The formed photoresist is then irradiated at predetermined sites using a suitable mask, to activate the photoactive agent at the predetermined sites. Typical structures formed by this process, depending on the predetermined sites irradiated, include various microelectronic structures such as transistors or integrated circuit boards, and the like. Any suitable form of radiation known to those skilled in the art may be employed in the method of the present invention. Preferably, the form of radiation employed will be dependent upon the transmission properties of the polymer selected. That is, the polymer selected should be essentially transparent to the wavelength of radiation which is to be employed. Suitable forms of radiation include ultraviolet, infrared, deep-ultraviolet, electron beam, X-ray, and ion beam. Preferably, the photoresist is irradiated with ultraviolet, deep-ultraviolet, electron-beam, X-ray, or ion beam radiation.

After radiation exposure, the photoresist is subjected to post-exposure baking. Post-exposure baking involves heating the photoresist to a sufficient temperature to provide the activation energy necessary to initiate the hydrolysis of the dissolution inhibitor. In the embodiment wherein the photoactive agent is a photoacid generator, the hydrolysis reaction is catalyzed by the acid generated upon exposure to radiation.

Hydrolysis of the dissolution inhibitor results in the production of an aldehyde and two molecules of carboxylic acid. Because carboxylic acids are more acidic than phenols, the carboxylic acid additives are more soluble in aqueous base developer solutions than phenolic additives. Accordingly, the presence of carboxylic acids produces a more drastic solubility differential between radiation exposed, and unexposed regions of the resist, thereby resulting in a photoresist having improved resolution. Post-exposure baking has the added benefit of removing compounds which may adversely impact the development of the photoresist. For example, the aldehyde generated by the hydrolysis of the dissolution inhibitor is advantageously evaporated off during post-exposure baking.

The appropriate heating conditions for post-exposure baking are necessary for the optimal performance of the resist. Improper heating conditions may have a negative impact on the sensitivity of the resist. Typically, the photoresist is heated at between about 75° C. to about 120° C. for between about 15 seconds to about 10 minutes. Preferably, the photoresist is heated at about 90° C. for between about 15 seconds to about 3 minutes, more preferably for about 30 seconds to about 3 minutes.

After heating the photoresist, matter is removed from the predetermined, irradiated sites to provide a positive-tone photoresist. The removal of matter from the predetermined, irradiated sites may be accomplished by any means known to those skilled in the art. Typically, matter is removed from the predetermined, irradiated sites by subjecting the resist to a developing medium, in which matter from the predetermined, irradiated sites is solubilized. Preferably, the photoresist is developed in aqueous base developing solution.

Several suitable developing techniques will be known to those skilled in the art. According to one exposure technique, the photoresist is immersed and agitated in a bath of developing solution maintained at a predetermined temperature for a predetermined period of time. According to a second exposure technique, the developing solution is sprayed across the surface of the photoresist. Yet another suitable exposure technique is the puddle technique, whereby a fixed amount of developer is dispensed on the photoresist and after a period of time, the developing solution is removed by directing a stream of deionized water onto the developed photoresist. Other suitable techniques will be readily determined by the skilled artisan.

The aqueous base developing solution may comprise any suitable basic solution known to those skilled in the art. Examples of suitable aqueous base solutions include but are not limited to solutions which comprise sodium hydroxide, potassium hydroxide, sodium carbonate, and various tetraalkylammonium hydroxides such as, for example, tetramethylammonium hydroxide, and tetrabutylammonium hydroxide. The aqueous base solutions may also include mixtures of any two or more of the foregoing base solutions. Preferably, the aqueous base solution comprises a tetraalkylammonium hydroxide, more preferably tetramethylammonium hydroxide.

The method of the present invention may also include additional steps, known to those skilled in the art. For example, the method of the present invention may also include etching the photoresist to transfer the image into the substrate. According to one preferred embodiment, etching is accomplished by plasma etching. One skilled in the art will appreciate that other finishing techniques are contemplated by the instant invention.

The following examples are provided to illustrate the present invention, and should not be construed as limiting thereof. In these examples, N means normal, $T_g$ means glass transition temperature, $M_w$ means molecular weight, $M_n$ means molecular number, NMR means Nuclear Magnetic Resonance, IR means infrared, UV means ultra violet, g means grams, cm means centimeters, nm means nanometers, μm means micrometers, mL means milliliters, μL means microliters, mmol means millimoles, hrs means hours, THF means tetrahydrofuran, $CCl_4$ means carbon tetrachloride, $MgSO_4$ means magnesium sulfate, KBr means potassium bromide, DMSO means dimethylsulfoxide, DCC means dicyclohexylcarbodiimide, mp means melting point, ° C. means degrees Centigrade, hrs means hours, min means minutes, s means seconds, and rpm means revolutions per minute.

Poly(4-hydroxystyrene) had the following physical characteristics: $T_g$ 160° C.; $M_w$ 31,000; $M_n$ 12,100 (universal calibration with in line Viscotek viscosity detector). A 1.0 μm thick film has an UV absorbance of 0.41 at 254 nm. AZ312MIF™ developer, 0.54N aqueous tetramethylammonium hydroxide solution, was obtained from Hoechst Celanese. The onium salt, triphenylsulfonium hexafluoroantimonate, was provided by General Electric. The acid anhydrides were synthesized from the corresponding carboxylic acids using DCC in diethyl ether.

EXAMPLE 1

Preparation of Methanediol bis(diphenylacetate)

Methanediol bis (diphenylacetate) is prepared from diphenylacetic acid and methylene bromide using the procedure of J. Shaw, et al., *J. Org. Chem.* 39: 1968 (1974). The crude product is recrystallized from THF-hexane mixture to yield methanediol bis(diphenylacetate) (64%) as a white crystalline solid. Analysis: mp 93.5°–94.0° C.; $^1$H NMR ($CDCl_3$) δ5.00 (s, $CH_2$, 2H), 5.85 (s, CH, 2H), 7.22–7.28 (m, ArH, 20H); $^{13}$C NMR ($CDCl_3$) δ56.6, 79.9, 127.4, 128.5, 128.6, 137.7, 171.0; IR (KBr) 3060, 3033, 1746, 1496, 1452, 1117, 992, 703 cm$^{-1}$. Elemental Analysis calculated for $C_{29}H_{24}O_4$: C, 79.80, H, 5.54; found: C, 80.00, H, 5.65.

EXAMPLE 2

Preparation of (4-M ethyphenyl) methanediol dipropionate

The acid anhydride (1.93 mmol) and the aldehyde (1.93 mmol) are dissolved in $CCl_4$ (1.3 mL) under an argon atmosphere. Phosphorus trichloride (0.193 mmol) is added and the mixture is stirred at 55° C. for 2–10 hrs. The progress of the reaction is monitored by periodic withdrawal of sample and analysis by $^1$H NMR. When no further change is observed in the composition of the reaction mixture, heating is stopped and chloroform (20 mL) is added. The solution is washed with water (3×7 mL), dried over $MgSO_4$ and evaporated to dryness. The crude product is purified by flash chromatography followed by distillation or recrystallization.

(4-Methylphenyl)methanediol dipropionate is obtained as a clear oil (23%). Analysis: $bp_{0.15}$110° C.; $^1$H NMR ($CDCl_3$) δ1.14 (t, $CH_3$, 6H), 2.36 (s, $CH_3$, 3H), 2.38 (dq, $CH_2$, 4H), 7.20 (d, ArH, 2H), 7.40 (d, ArH, 2H), 7.66 (s, CH, 1H); $^{13}$C NMR ($CDCl_3$) δ8.7, 21.2, 27.4, 89.6, 126.5, 129.2, 132.6, 139.6, 172.3; IR (KBr) 2985, 1762, 463, 1180, 818 cm$^{-1}$; UV(ethanol) $\lambda_{max}$218 nm (400), 228 nm (400), 256 nm (400).

EXAMPLE 3

Methanediol bis(diphenylacetate)

The acid anhydride (1.93 mmol) and the aldehyde (1.93 mmol) are dissolved in $CCl_4$ (1.3 mL) under an argon atmosphere. Phosphorus trichloride (0.193 mmol) is added and the mixture is stirred at 55° C. for 2–10 hrs. The progress of the reaction is monitored by periodic withdrawal of sample and analysis by $^1H$ NMR. When no further change is observed in the composition of the reaction mixture, heating is stopped and chloroform (20 mL) is added. The solution is washed with water (3×7 mL), dried over $MgSO_4$ and evaporated to dryness. The crude product is purified by flash chromatography followed by distillation or recrystallization.

Methanediol bis(diphenylacetate) is obtained as a white crystalline solid (47%). Analysis: mp 79.5°–80.0° C. ($CHCl_3$-hexane); $^1H$ NMR ($CDCl_3$) δ2.38 (s, $CH_3$, 3H), 7.26 (d, ArH, 2H), 7.43 (t, ArH, 4H), 7.56 (t, ArH, 2H), 7.60 (d, ArH, 2H), 8.08 (m, ArH, 4H), 8.17 (s, CH, 1H); $^{13}C$ NMR ($CDCl_3$) δ21.4, 90.7, 126.7, 128.4, 129.2, 130.0, 132.8, 133.5, 139.8, 164.4; IR (KBr) 1740, 1724, 1277, 1059, 708 $cm^{-1}$; UV (ethanol) $\lambda_{max}$ 244 nm (17100). Elemental Analysis calculated for $C_{22}H_{18}O_4$: C, 76.29, H, 5.24; found: C, 76.17, H, 5.19.

EXAMPLE 4

Phenylmethanediol bis(phenylacetate)

The acid anhydride (1.93 mmol) and the aldehyde (1.93 mmol) are dissolved in $CCl_4$ (1.3 mL) under an argon atmosphere. Phosphorus trichloride (0.193 mmol) is added and the mixture is stirred at 55° C. for 2–10 hrs. The progress of the reaction is monitored by periodic withdrawal of sample and analysis by $^1H$ NMR. When no further change is observed in the composition of the reaction mixture, heating is stopped and chloroform (20 mL) is added. The solution is washed with water (3×7 mL), dried over $MgSO_4$ and evaporated to dryness. The crude product is purified by flash chromatography followed by distillation or recrystallization.

Phenylmethanediol bis(phenylacctate) is obtained as a white crystalline solid (51%). Analysis: mp 47.5°–48.0° C. ($CHCl_3$-hexane); $^1H$ NMR ($CDCl_3$) δ3.66 (s, $CH_2$, 4H), 7.20–7.40 (m, ArH, 15H), 7.70 (s, CH, 1H); $^{13}C$ NMR ($CDCl_3$) δ40.9, 90.2, 126.6, 127.2, 128.5, 128.6, 129.3, 129.7, 133.1, 135.1, 169.4; IR (KBr) 1758, 1735, 1143, 954, 698 $cm^{-1}$; UV(ethanol) $\lambda_{max}$ 218 nm (700), 232 nm (700), 258 nm (500). Elemental Analysis calculated for $C_{23}H_{20}O_4$:C, 76.65, 5.59; found: C, 76.78, H, 5.63.

EXAMPLE 5

Phenylmethanediol bis(diphenylacetate)

The acid anhydride (1.93 mmol) and the aldehyde (1.93 mmol) are dissolved in $CCl_4$ (1.3 mL) under an argon atmosphere. Phosphorus trichloride (0.193 mmol) is added and the mixture is stirred at 55° C. for 2–10 hrs. The progress of the reaction is monitored by periodic withdrawal of sample and analysis by $^1H$ NMR. When no further change is observed in the composition of the reaction mixture, heating is stopped and chloroform (20 mL) is added. The solution is washed with water (3×7 mL), dried over $MgSO_4$ and evaporated to dryness. The crude product is purified by flash chromatography followed by distillation or recrystallization.

Phenylmethanediol bis(diphenylacetate) is obtained as a white crystalline solid (20%). Analysis: mp 79.0°–79.5° C. ($Et_2O$-hexane); $^1H$ NMR ($CDCl_3$) δ5.02 (s, CH 2H), 7.10–7.40 (m, ArH, 25H), 7.85 (s, CH, 1H); $^{13}C$ NMR ($CDCl_3$) δ56.8, 90.5, 126.6, 127.3, 127.3, 128.5, 128.6, 128.7, 129.7, 137.9, 170.2; IR (KBr) 3063, 3032, 1761, 1497, 1455, 1119, 957, 698 $cm^{-1}$; UV(ethanol) $\lambda_{max}$ 234 nm (2700), 260 nm (1300). Elemental Analysis calculated for $C_{35}H_{28}O_4$: C, 82.01, H, 5.51; found: C, 82.05, H, 5.58.

EXAMPLE 6

(4-Acecyioxyphenyl)methanediol bis(diphenylacetate)

The acid anhydride (1.93 mmol) and the aldehyde (1.93 mmol) are dissolved in $CCl_4$ (1.3 mL) under an argon atmosphere. Phosphorus trichloride (0.193 mmol) is added and the mixture is stirred at 55° C. for 2–10 hrs. The progress of the reaction is monitored by periodic withdrawal of sample and analysis by $^1H$ NMR. When no further change is observed in the composition of the reaction mixture, heating is stopped and chloroform (20 mL) is added. The solution is washed with water (3×7 mL), dried over $MgSO_4$ and evaporated to dryness. The crude product is purified by flash chromatography followed by distillation or recrystallization.

(4-Acetyloxyphenyl) methanediol bis(diphenylacetate) is obtained as a white crystalline solid (38%). Analysis: mp 112.0°–112.5° C. ($CHCl_3$-hexane); $^1H$ NMR ($CDCl_3$) δ2.29 (s, $CH_3$ 3H), 5.01 (s, CH, 2H), 7.02 (d, ArH, 2H), 7.15–7.30 (m, ArH, 20H), 7.32 (d, ArH, 2H), 7.84 (s, CH, 1H); $^{13}C$ NMR ($CDCl_3$) δ21.1, 56.8, 89.9, 121.7, 127.3, 128.0, 128.6, 128.7, 132.4, 137.8, 151.5, 169.1, 170.2; IR (KBr) 3063, 3031, 1761, 1497, 1195, 996, 701 $cm^{-1}$; UV(ethanol) $\lambda_{max}$ 244 nm (1300), 245 nm (1300), 254 nm (1300), 260 nm (1400). Elemental Analysis calculated for $C_{37}H_{30}O_6$: C, 77.88, H, 5.30; found: C, 7.84, H, 5.37.

EXAMPLE 7

Phenylmethanediol bis(2,4,6-trimethylbenzoate)

The acid anhydride (1.93 mmol) and the aldehyde (1.93 mmol) are dissolved in $CCl_4$(1.3 mL) under an argon atmosphere. Phosphorus trichloride (0.193 mmol) is added and the mixture is stirred at 55° C. for 2–10 hrs. The progress of the reaction is monitored by periodic withdrawal of sample and analysis by $^1H$ NMR. When no further change is observed in the composition of the reaction mixture, heating is stopped and chloroform (20 mL) is added. The solution is washed with water (3×7 mL), dried over $MgSO_4$ and evaporated to dryness. The crude product is purified by flash chromatography followed by distillation or recrystallization.

Phenylmethanediol bis (2,4,6-trimethylbenzoate) is obtained as a white crystalline solid (57%). Analysis: mp 105.0°–105.5° C. (hexane); $^1H$ NMR ($CDCl_3$) δ2.24 (s, $CH_3$ 12H), 2.26 (s, $CH_3$, 6H), 6.83 (s, ArH, 4H), 7.41 (m, ArH, 3H), 7.64 (m, ArH, 2H), 8.16 (s, CH, 1H); $^{13}C$ NMR ($CDCl_3$) δ19.8, 21.1, 90.7, 127.1, 128.5, 128.6, 129.6, 129.9, 135.3, 135.7, 139.8, 167.8, IR (KBr) 2923, 1749, 1727, 1613, 1274, 1253, 1049, 697 $cm^{-1}$; UV(ethanol) $\lambda_{max}$ 250 nm (7900). Elemental Analysis calculated for $C_{27}H_{28}O_4$: C, 77.86, H, 6.78; found: C, 77.03, H, 6.76.

EXAMPLE 8

Measurement of hydrolysis rate in solution

A stock solution of triflic acid is prepared by adding triflic acid (1.2 μL, 0.0136 mmol) to DMSO-$d_6$ (2.3 mL). The phenylmethanediol diester compound (0.00977 mmol) is dissolved in a mixture of DMSO-$d_6$ (0.45 mL) and $H_2O$ (0.0140 mmol). A measured volume (0.05 mL) of the triflic acid stock solution is then added and the resulting solution mixed thoroughly before being transferred into a NMR tube. The NMR tube is immersed in an oil bath maintained at 110±1° C. and $^1H$ NMR spectra measured periodically. The results are reported in Table 1 below.

TABLE 1

$^1H$ NMR kinetics data for traffic acid catalyzed hydrolysis of phenylmethanediol diesters inaqueous DMSO at 110° C.

| Compound | k-mol$^{-1}$dm$^3$min$^{-1}$ | t½$^{a,\ min}$ |
|---|---|---|
| Methanediol bis(diphenylacetate) | 0.00239 | 33000 (estimated) |

TABLE 1-continued $^1H$ NMR kinetics data for traffic acid catalyzed hydrolysis of phenylmethanediol diesters inaqueous DMSO at 110° C.

| Compound | k-mol$^{-1}$dm$^3$min$^{-1}$ | t½$^{a,\ min}$ |
|---|---|---|
| (4-Methyphenyl) methanediol dipropionate | 1.456 | 54 |
| Methanediol bis(diphenylacetate) | 0.336 | 240 |
| Phenylmethanediol bis(phenylacetate) | 0.169 | 700 |
| Phenylmethanediol bis(diphenylacetate) | 0.053 | 2200 |
| (4-Acetyloxyphenyl)methanediol bis(diphenylacetate) | 0.079 | 1500 |
| Phenylmethanediol bis(2,4,6-trimethylbenzoate) | 0.239 | 500 |

$^a$13Reaction time for 50% conversion.

EXAMPLE 9

Resist formulation and processing

Poly(4-hydroxystyrene) (0,214 g, 75.4 wt. %), the phenylmethanediol diester (0.0575 g, 20.2 wt. %) and triphenylsulfonium hexafluoroantimonate (0.0125 g, 4.4 wt. %) are dissolved in propylene glycol monomethyl ether acetate (1.2 g) and filtered through a 0.45 μm filter. Spin-coating onto silicon wafers at 3600 rpm for 30 s followed by heating at 90° for 3 min gives 1.0±0.05 μm films. All samples, unless otherwise stated, are heated at 100° C. for 90 s following radiation exposure. Solvent development of the resists is accomplished by dipping the wafer in a beaker of rapidly stirred solution of 30% aqueous AZ312MIF™.

EXAMPLE 10

$^1$ NHR analyses of resist films

The resist solution is spin-coated onto a 2 inch silicon wafer and heated at 90° C. for 3 min to give 1.0±0.05 μm films. Following exposure to a measured dosage of deep-UV radiation and post-exposure bake, the resist films are dissolved in deuterated acetone and the $^1H$ NMR spectra recorded. The results are reported in Table 2 below.

TABLE 2

$^1H$ NMR analyses of the compositions of radiation exposed resist films after post-exposure baking.

| Resist$^a$ | Process | Starring material remaining, % | Acid detected, % | Acid evaporated$^b$, % | Alkylated polymer, % | Aldehyde detected, % |
|---|---|---|---|---|---|---|
| A | 2.0 mJ/cm$^2$, 100°(5 min) | 100 | 0 | 0 | 0 | 0 |
| B | 1.0 mJ/cm$^2$, 100°(5 min) | 8 | 0 | 92 | 0 | 35 |
| C | 2.5 mJ/cm$^2$, 100°(5 min) | 5 | 36 | 59 | 0 | 47 |
| D | 5.0 mJ/cm$^2$, 100°(5 min) | 2 | 41 | 57 | 0 | 0 |
|  | 5.0 mJ/cm$^2$, 80°(5 min) | 2 | 44 | 54 | 0 | 5 |
|  | 5.0 mJ/cm$^2$, 80°(30 s) | 2 | 66 | 32 | 0 | 13 |
|  | 1.5 mJ/cm$^2$, 100°(45 s) | 2 | 55 | 43 | 0 | 6 |
| E | 5.0 mJ/cm$^2$, 100°(90 s) | 3 | 86 | 11 | 0 | 2 |
|  | 1.5 mJ/cm$^2$, 100°(45 s) | 20 | 70 | 10 | 0 | 8 |
| F | 1.4 mJ/cm$^2$, 100°(90 s) | 3 | 82 | 15 | 0 | 31 |
| G | 1.4 mJ/cm$^2$, 100°(90 s) | 14 | 67 | 19 | 19 | 10 |
|  | 2.0 mJ/cm$^2$, 70°(1 min) | 20 | 73 | 7 | 8 | 27 |

$^a$Resist A contains additive 1a, resist B contains additive 1b, similar terminology applies to the other resists;
$^b$Calculated by difference.

The foregoing is illustrative of the present invention and is not to be construed as limiting thereof. The invention is defined by the following claims, with equivalents of the claims to be included therein.

That which is claimed is:

1. A positive-tone photoresist comprising a polymer, a photoactive agent, and a dissolution inhibitor, said dissolution inhibitor comprising a compound of Formula I:

$$R_1 \underset{O}{\overset{O}{\|}}{\diagdown} O \diagdown \underset{H}{\overset{R_2}{\diagup}} \diagdown O \underset{O}{\overset{O}{\|}}{\diagup} R_1 \quad (I)$$

wherein:

$R_1$ is a $C_1$–$C_{20}$ alkyl, cyclo alkyl, benzyl, phenyl, alkyl substituted cyclo alkyl, alkoxy substituted cyclo alkyl, alkyl substituted phenyl, acetoxy substituted phenyl, hydroxy substituted phenyl, t-butyloxycarbonyloxy substituted phenyl, diphenyl alkyl, alkyl substituted diphenyl, alkoxy substituted diphenyl, alkyl substituted diphenyl alkyl, or alkoxy substituted diphenyl alkyl; and $R_2$ is a $C_1$–$C_{20}$ alkyl, cyclo alkyl, benzyl, phenyl, alkyl substituted cyclo alkyl, alkoxy substituted cyclo alkyl, alkyl substituted phenyl, alkoxy substituted phenyl, hydroxy substituted phenyl, acetoxy substituted phenyl, or t-butyloxycarbonyloxy substituted phenyl.

2. The positive-tone photoresist according to claim 1, wherein said polymer is essentially transparent in at least a portion of the ultraviolet region of the electromagnetic spectrum.

3. The positive-tone photoresist according to claim 1, wherein said polymer is soluble in aqueous base.

4. The positive-tone photoresist according to claim 1, said polymer containing phenolic, carboxylic acid or maleimide groups.

5. The positive-tone photoresist according to claim 1, wherein said polymer is selected from the group consisting of poly(hydroxystyrene), novolak, poly(dimethylhydroxystyrene), polymethacrylic acid, polyvinylbenzoic acid, poly(2-hydroxyhexafluoropropyl styrene), copolymers of styrene and maleimide, and copolymers or mixtures thereof.

6. The positive-tone photoresist according to claim 1, wherein said polymer is poly(hydroxystyrene).

7. The positive-tone photoresist according to claim 1, wherein said polymer is novolak.

8. The positive-tone photoresist according to claim 1, wherein said photoactive agent is a photoacid generator.

9. The positive-tone photoresist according to claim 1, wherein said photoactive agent is selected from the group consisting of sulfonium or iodonium salts, halogenated aromatic compounds, o-nitrobenzyl sulfonates, tris-(methanesulfonyloxy)benzene, and aryl naphthoquinonediazide-4-sulfonates.

10. The positive-tone photoresist according to claim 1, wherein said photoactive agent is selected from the group consisting of triphenylsulfonium hexafluoroantimonate, triphenylsulfonium triflate, triphenylsulfonium hexafluorophosphate, triphenylsulfonium hexafluoroarsenate, diphenyliodonium hexafluoroantimonate, diphenyliodonium triflate, diphenyliodonium hexafluorophosphate, and diphenyliodonium hexafluoroarsenate.

11. The positive-tone photoresist according to claim 1, wherein $R_1$ is alkyl and $R_2$ hydrogen.

12. The positive-tone photoresist according to claim 1, wherein $R_1$ is alkyl and $R_2$ is alkyl substituted phenyl.

13. The positive-tone photoresist according to claim 1, wherein $R_1$ is phenyl, and $R_2$ is alkyl substituted phenyl.

14. The positive-tone photoresist according to claim 1, wherein $R_1$ is alkyl substituted phenyl and $R_2$ is phenyl.

15. The positive-tone photoresist according to claim 1, wherein $R_1$ is diphenyl methyl, and $R_2$ is phenyl.

16. The positive-tone photoresist according to claim 1, wherein $R_1$ is diphenyl methyl, and $R_2$ is acetoxy phenyl.

17. The positive-tone photoresist according to claim 1, wherein $R_1$ is tri-alkyl substituted phenyl, and $R_2$ is phenyl.

18. The positive-tone photoresist according to claim 1, wherein $R_1$ is alkyl and $R_2$ is phenyl.

19. The positive-tone photoresist according to claim 1, wherein $R_1$ is alkyl and $R_2$ is alkoxy substituted phenyl.

20. The positive-tone photoresist according to claim 1, wherein said dissolution inhibitor is selected from the group consisting of (4-methylphenyl)methanediol dipropionate, (4-methylphenyl)methanediol dibenzoate, phenylmethanediol bis(phenylacetate), phenylmethanediol bis(diphenylacetate), (4-acetyloxyphenyl)methanediol bis-(diphenylacetate), phenylmethanediol bis(2,4,6-trimethylbenzoate), (4-methoxyphenyl)methanediol bis(diphenylacetate), (4-ethoxyphenyl)methanediol bis(diphenylacetate), and (4- hydroxyphenyl)methanediol bis(diphenylacetate).

21. The positive-tone photoresist according to claim 1 coated on a substrate.

* * * * *